United States Patent
Tiapkin et al.

(10) Patent No.: US 11,774,521 B2
(45) Date of Patent: Oct. 3, 2023

(54) POSITION MEASURING MECHANISM AND MEASURING METHOD OF LINEAR MOTION SYSTEM

(71) Applicant: HIWIN MIKROSYSTEM CORP., Taichung (TW)

(72) Inventors: Mikhail Tiapkin, Taichung (TW); Oleg Tolstykh, Taichung (TW); Sergey Volkov, Taichung (TW); Gennady Tyapkin, Taichung (TW); Aleksandr Balkovoi, Taichung (TW)

(73) Assignee: HIWIN MIKROSYSTEM CORP., Taichung (TW)

( * ) Notice: Subject to any disclaimer, the term of this patent is extended or adjusted under 35 U.S.C. 154(b) by 375 days.

(21) Appl. No.: 17/153,628

(22) Filed: Jan. 20, 2021

(65) Prior Publication Data

US 2022/0229123 A1 Jul. 21, 2022

(51) Int. Cl.
*G01R 33/022* (2006.01)
*H02P 25/064* (2016.01)
(Continued)

(52) U.S. Cl.
CPC ........... *G01R 33/022* (2013.01); *G01D 5/145* (2013.01); *H02K 16/04* (2013.01); *H02P 25/064* (2016.02); *H02P 6/006* (2013.01)

(58) Field of Classification Search
CPC .............................. G01R 33/022; G01D 5/145
See application file for complete search history.

(56) References Cited

U.S. PATENT DOCUMENTS 8,796,959 B2 * 8/2014 Sato ................... H02P 25/06
                                                    318/135
9,871,478 B2 * 1/2018 Yamada ............. H02K 11/0094
(Continued)

FOREIGN PATENT DOCUMENTS

| JP | 2008-536145 A | 9/2008 |
| KR | 1020150111375 | 10/2015 |
| TW | 201944033 A | 11/2019 |

OTHER PUBLICATIONS

Shengchao Zhen et al., "Force Ripple Modeling and Minimizing of an Ironless Permanent-Magnet Linear Synchronous Motor", Int. J. Precis. Eng. Manuf. 20, 927-935 (2019). https://doi.org/10.1007/s12541-019-00065-5.

(Continued)

*Primary Examiner* — Walter L Lindsay, Jr.
*Assistant Examiner* — Milton Gonzalez
(74) *Attorney, Agent, or Firm* — GUICE PATENTS PLLC

(57) ABSTRACT

The invention discloses a position measuring mechanism and a measuring method of a linear motion system in which two sensors are respectively disposed on two sides of a stator, in addition to allowing a moving portion to perform bidirectional movement, under a premise of not increasing a quantity of the sensors, a measuring range of the sensors can be calculated based on information measured by the sensors themselves. Furthermore, the invention further combines measurement sections respectively measured by the two sensors to ensure an accuracy of position feedback, instead of the conventional technique using an operational method of combining sinusoidal and cosine signals.

8 Claims, 7 Drawing Sheets

(51) Int. Cl.
  *H02K 16/04*    (2006.01)
  *G01D 5/14*     (2006.01)
  *H02P 6/00*     (2016.01)

(56) References Cited

U.S. PATENT DOCUMENTS

| | | | |
|---|---|---|---|
| 10,393,548 B2 * | 8/2019 | Shimizu | H02K 11/215 |
| 10,427,542 B2 * | 10/2019 | Hanaka | H02K 11/215 |
| 2019/0047794 A1 | 2/2019 | Ozimek et al. | |
| 2020/0166389 A1 | 5/2020 | Huang et al. | |

OTHER PUBLICATIONS

G. Rigatos, P. Siano, F. Marignetti and I. Gros, "A nonlinear optimal control approach for PM Linear Synchronous Motors," 2018 IEEE 16th International Conference on Industrial Informatics (INDIN), 2018, pp. 453-458, doi: 10.1109/NDIN.2018.8472019.

* cited by examiner

POSITION MEASURING MECHANISM AND MEASURING METHOD OF LINEAR MOTION SYSTEM

BACKGROUND OF THE INVENTION

Field of Invention

The invention relates to position measurement technology, and more particularly to a position measuring mechanism and a measuring method of a linear motion system.

Related Art

Doubly Salient Permanent Magnet-Linear Synchronous Motor (DSPM-LSM) of discontinuous stator mainly consists of a plurality of fixed stators respectively having a plurality of coils of different phases, and one carrier or a plurality of carriers with magnet arrays, and actions of each of the carriers are controlled and corrected by feedback of a position of each of the carriers along a moving path. The above has been disclosed in patents EP3015933A1, U.S. Pat. No. 8,497,643B2, U.S. Pat. No. 8,796,959B2, EP2182627B1, US20190190366A1 and documents "Novel Force Ripple Reduction Method for a Moving-magnet Linear Synchronous Motor with a Segmented Stator", "Cogging Force Verification by Deforming the Shape of the Outlet Edge at the Armature of a Stationary Discontinuous Armature PM-LSM".

Under a premise of not requiring high-precision measurement results, the measurement system can use Hall sensors, which can reduce the complexity and costs of the position feedback measurement system. Wherein the magnet array of DSPM-LSM can be used as a measuring scale, since a distance that each of the Hall sensors can measure is less than a length of a magnet array, in order to provide position feedback information in an entire moving range of the carrier, the Hall sensors must be arranged along a moving direction of the carrier, and measuring ranges of the adjacent sensors are set to overlap each other.

U.S. Pat. No. 8,497,643 discloses a linear scale for obtaining a distance from a reference point, in which operation is performed by mainly using changes in magnetic flux density generated by a magnet and with sine signals and cosine signals sensed by a transducer. However, the method will reduce accuracy due to end-effects of the magnetic flux. In order to improve the precision, U.S. Pat. Nos. 8,497,643 and 6,713,902B2 further disclose the moving position or deflection direction of the first and last magnets in the magnet array.

U.S. Pat. No. 8,796,959B2 utilizes the previously measured shifted value between the adjacent sensors in conjunction with the positional relationship of each of the sensors, and uses a single processing unit to perform operation. In this way, the sensors, servo drivers, and processing units need to be arranged in a special digital network, but they will decrease long-term repeatability of the system due to temperature deformation and offset changes.

US20130229134A1 discloses a method of using position feedback in conjunction with offset of the adjacent modules and calibrating an accuracy of the measuring scale. Wherein the discretely configured linear motor system is composed of a plurality of modules, each of the modules comprises a single sensor, a stator and a drive unit, and a plurality of control units are used to control the modules and send position information. Accordingly, this method only uses the single sensor, which results in the carrier having only a single actuation direction effective, which means that when the carrier moves in an opposite direction, it will be too late for the modules to obtain a position of the carrier, as a result, an acting force of the DSPM-LMS is significantly reduced.

US20130037384A1 discloses an enhanced multi-position detection system applied to electromagnetic transmission, which mainly comprises a plurality of magnetic field sensors arranged at a fixed distance on an operating track for detecting positions of transmission elements on the operating track. The sensors are connected to a single processing unit. Furthermore, in order to coordinate with the position feedback detected by the sensors, the patent proposes to increase a quantity of the sensors and their functions; however, this method reduces the possibility of system modularization. Because in industrial applications, modularization of DSPM-LSM can improve the maintainability and substitutability of various components in a system; obviously, the conventional technology is still not sophisticated enough.

SUMMARY OF THE INVENTION

Therefore, a main object of the invention is to provide a position measuring mechanism and a measuring method of a linear motion system in which two sensors are respectively disposed on two sides of a stator, in addition to allowing a moving portion to perform bidirectional movement, under a premise of not increasing a quantity of the sensors, a measuring range of the sensors can be calculated based on information measured by the sensors themselves.

Another object of the invention is to provide a position measuring mechanism and a measuring method of a linear motion system in which measurement sections respectively measured by two sensors are combined to ensure an accuracy of position feedback, instead of the conventional technique using an operational method of combining sinusoidal and cosine signals.

In order to achieve the above objects, the position measuring mechanism provided by the invention comprises: a base; a moving portion capable of moving relative to the base; at least one magnet array disposed in the moving portion; a first sensing portion and a second sensing portion respectively disposed on the base at intervals for sensing a magnetic field of the magnet array; a third sensing portion having a signal unit disposed on the moving portion, and a sensitive element disposed on the base for sensing the signal unit; and a processing portion receiving sensing signals of the first sensing portion and the second sensing portion respectively, calculating a subcycle corresponding to the magnet array, and performing operation in conjunction with sensing data of the sensitive element to obtain a movement path of the moving portion, and then feeding the movement path back to a driver to adjust a movement pattern of the moving portion.

In one embodiment, the invention further comprises a plurality of measurement modules respectively including the first sensing portion, the second sensing portion and the third sensing portion, and a distance between the two adjacent measurement modules is equal to a length of the magnet array. Wherein, in order to simplify the current commutation law of a stator current, a distance between the two adjacent measurement modules is equal to a length of the magnet array.

Wherein the driver controls a current of the stator provided on the base, and uses a fieldbus to connect to a motion controller, so that information detected by the sensing portions is processed by a single device, thereby reducing the difficulty of identifying a position of a carrier along the movement path.

Another object of the invention is to provide a position measuring method to combine signals sensed by the first sensing portion and the second sensing portion in a measuring range respectively with a juncture.

In order to estimate an exact position of the measuring range, the invention uses subcycle information and signal amplitudes sensed by the first sensing portion and the second sensing portion for determination.

Wherein the measuring range is divided into a first measurement section of the first sensing portion and a second measurement section of the second sensing portion with the juncture, the first measurement section and the second measurement section are respectively configured along a movement direction of the moving portion and are adjacent to each other.

When the moving portion moves and displaces from right to left, a starting point of the measuring range is defined as: a signal amplitude sensed by the first sensing portion is less than a predetermined high threshold value, and a subcycle position of a signal sensed by the first sensing portion is equal to 180°; an ending point of the measuring range is defined as: a signal amplitude sensed by the second sensing portion is higher than a predetermined low threshold value, and a subcycle position of a signal sensed by the second sensing portion is equal to 180'; and when the moving portion moves and displaces from left to right, a starting point of the measuring range is defined as: a signal amplitude sensed by the first sensing portion is greater than the low threshold value, and a subcycle position of a signal sensed by the first sensing portion is equal to 180°; an ending point of the measuring range is defined as: a signal amplitude sensed by the second sensing portion is less than the low threshold value, and a subcycle position of a signal sensed by the second sensing portion is equal to 180°.

BRIEF DESCRIPTION OF THE DRAWINGS

In order to enable the examiner to further understand the objects, features, and achieved efficacies of the invention, preferred embodiments are listed below for detailed explanation in conjunction with the drawings, wherein.

DETAILED DESCRIPTION OF THE INVENTION

Hereinafter, a preferred embodiment of the invention is described in conjunction with the drawings.

In a measuring mechanism 10 of a linear motion system provided in a preferred embodiment of the invention, a Doubly Salient Permanent Magnet-Linear Synchronous Motor (DSPM-LSM) of discontinuous stator is taken as an example, and the measuring mechanism 10 comprises a base 20, a moving portion 30 and a measurement module 40.

Figure 1:
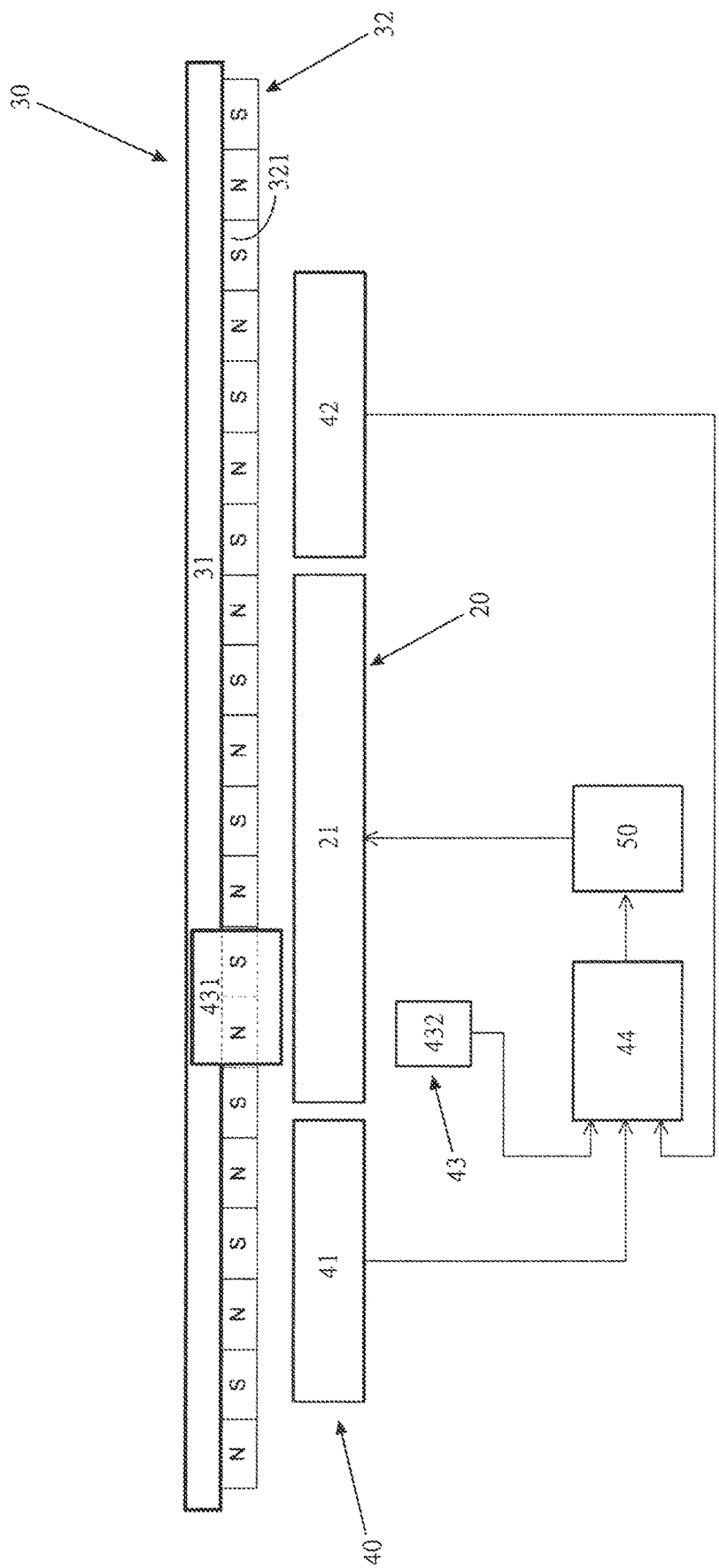
FIG. 1 is a schematic diagram of a preferred embodiment of the invention.

As shown in FIG. 1, the base 20 has a predetermined length (not shown in the figure), and at least one stator 21 is disposed on the base 20 by extending along a long axial direction of the base 20.

The moving portion 30 has a carrier 31 located by one side of the base 20 and separated from the stator 21 from one side of the carrier 31, and a one-dimensional magnet array 32 composed of a plurality of magnets 321 sequentially disposed on the carrier 31, through magnetic field interaction between the stator 21 as a primary side and the magnet array 32, the moving portion 30 is capable of displacing along the long axial direction of the base 20; however, the technical content of using the stator 21 as the primary side and the moving portion 30 as a secondary side pertains to the scope of the prior art and is known by those having ordinary skill in the art to which the invention pertains, so it will not be repeat herein.

Figure 3:
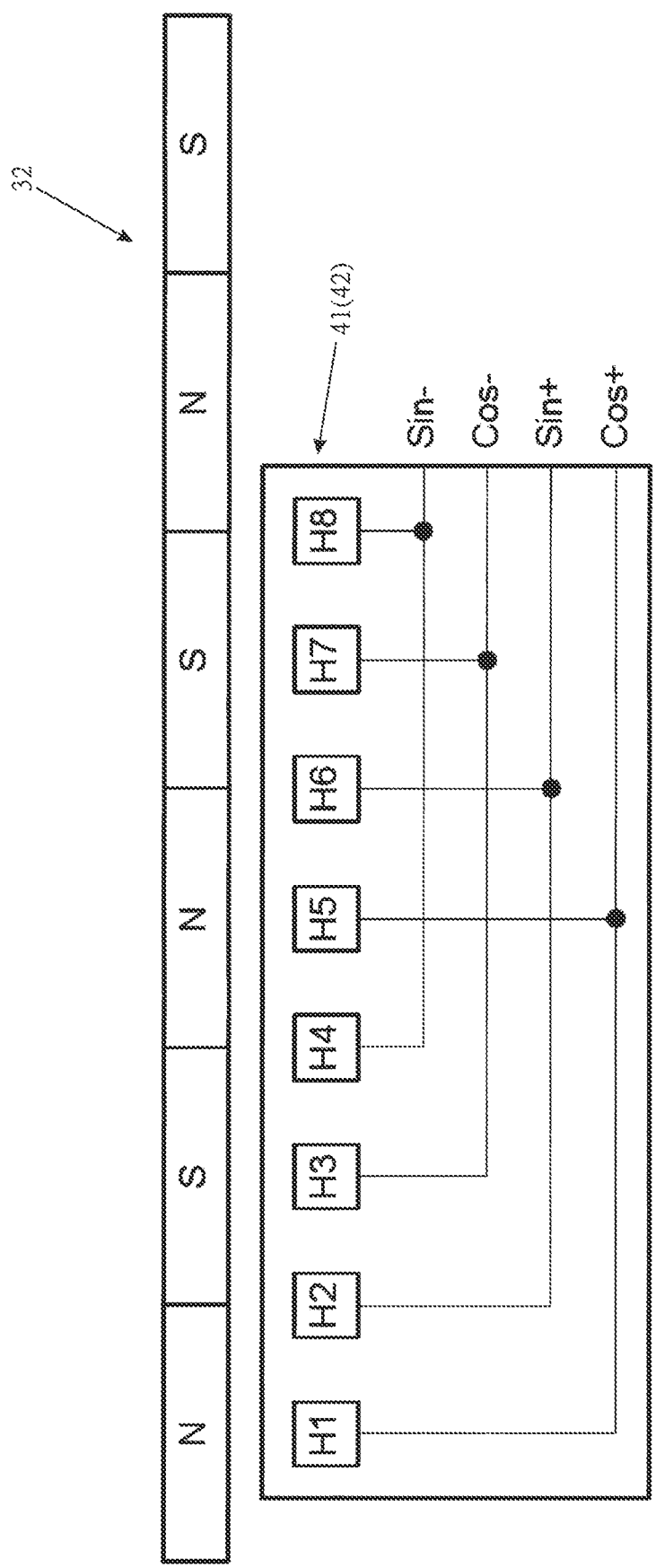
FIG. 3 is a schematic diagram of eight magnetic sensitive elements included in a first sensing portion and a second sensing portion in a preferred embodiment of the invention.

The measurement module 40 has a first sensing portion 41, a second sensing portion 42, a third sensing portion 43 and a processing portion 44, wherein: the first sensing portion 41 and the second sensing portion 42 are disposed on the base 20, and are respectively located at two ends of the stator 21 corresponding to the long axial direction of the base 20, thereby the stator 21 is interposed between the first sensing portion 41 and the second sensing portion 42, as shown in FIG. 3, the first sensing portion 41 and the second sensing portion 42 respectively include eight magnetic sensitive elements (Hall sensors, H1~H8) for sensing magnetic field changes of the magnet array 32; the third sensing portion 43 comprises a signal unit 431 disposed on the carrier 31 to generate specific physical signals, and a sensitive element 432 fixed on the base 20 to sense signals generated by the signal unit 431; and the processing portion 44 receives sensing data of the first sensing section 41, the second sensing section 42 and the sensitive element 432, after performing operation to obtain position information related to the moving portion 30, the position information is fed back to a driver 50, and then the driver 50 performs power supply control to the stator 21.

Figure 2:
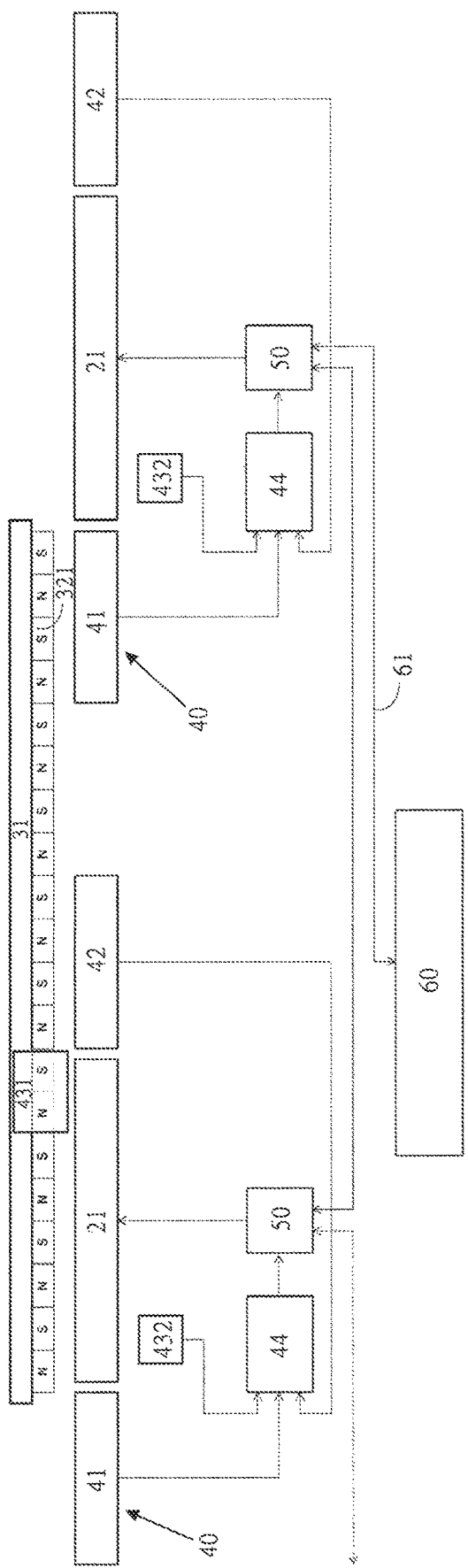
FIG. 2 is a schematic diagram of another embodiment of the invention showing that a quantity of measurement modules is two.

Further, when a moving stroke of the moving portion 30 exceeds a range that a single stator as a primary side is capable of acting on, a quantity of the stator 21 in the base 20 can be made to be numerous, as shown in FIG. 2 illustrating the two stators 21 as an example, the two stators 21 are coaxially fixed on the base 20 along a long axial direction, and a quantity of the measurement module 40 increases to two to match with an increased quantity of the stators 21, but the added measurement module 40 does not include an increase of the signal unit 431, that is, a quantity of the signal unit 431 is the same as a quantity of the carrier 31, and remains single. In this example, a distance between the two adjacent measurement modules 40 is equal to a length of the magnet array 32.

Please refer to FIG. 2 for another embodiment of the invention, differences between this embodiment and the previous preferred embodiment lie in a quantity of the measurement module 40 being two, the two measurement modules 40 being arranged along a movement direction of the carrier 31, and providing position feedback along a movement path. For the convenience of control, the two measurement modules 40 can be connected to each other, and then connected by a fieldbus 61 to a motion controller 60 to handle movement control of the carrier 31 or a plurality of the carriers 31.

Figure 7:
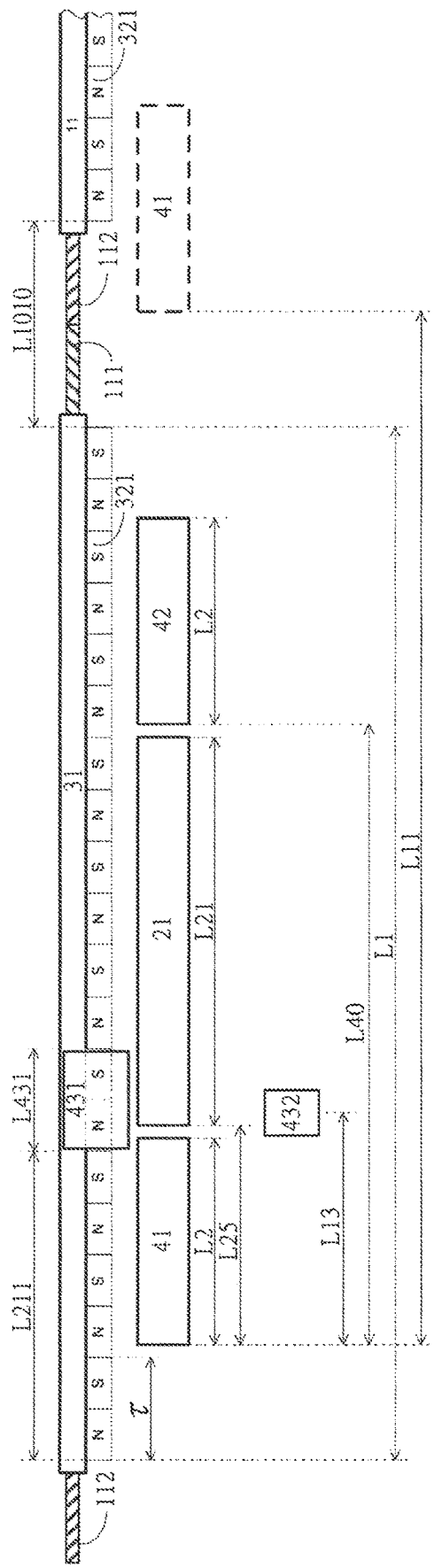
FIG. 7 is a schematic diagram of a measuring mechanism of an embodiment of the invention showing lengths, spacings and positional relationships of each of elements.

As shown in FIG. 3, the eight magnetic sensitive elements (Hall sensors, H1~H8) respectively included in the first sensing portion 41 or the second sensing portion 42 are arranged from left to right in sequence, and each of the magnetic sensitive elements H1~H8 is shifted on τ/4 along a measuring axis respectively, as shown in FIG. 7, T is a magnetic period of the magnet array 32, that is, a distance between the magnets 321 of a same magnetism, so that lengths of the first sensing portion 41 and the second sensing portion 42 are respectively equivalent to the two magnetic periods T, and the first magnetic sensitive element H1 and the fifth magnetic sensitive element H5, the second magnetic sensitive element H2 and the sixth magnetic sensitive element H6, the third magnetic sensitive element H3 and the seventh magnetic sensitive element H7, the fourth magnetic sensitive element H4 and the eighth magnetic sensitive element H8 are respectively connected in parallel to form four groups to optimize an average feedback error to improve accuracy and sensitivity of position feedback. Signals output by the magnetic sensitive elements H1~H8 connected in parallel in four groups are sine and cosine differential signals of Cos+, Sin+, Cos−, Sin−, as U Cos+=U cos(a), U Sin+=U sin(α), U Cos−=−U cos(α), U Sin−=−U sin(α), where α is a subcycle position (angle) calculated by the processing portion 44 according to a formula α=atan2 ((U Cos+−U Cos−)/(U Sin+−U Sin−)).

Figure 5A:
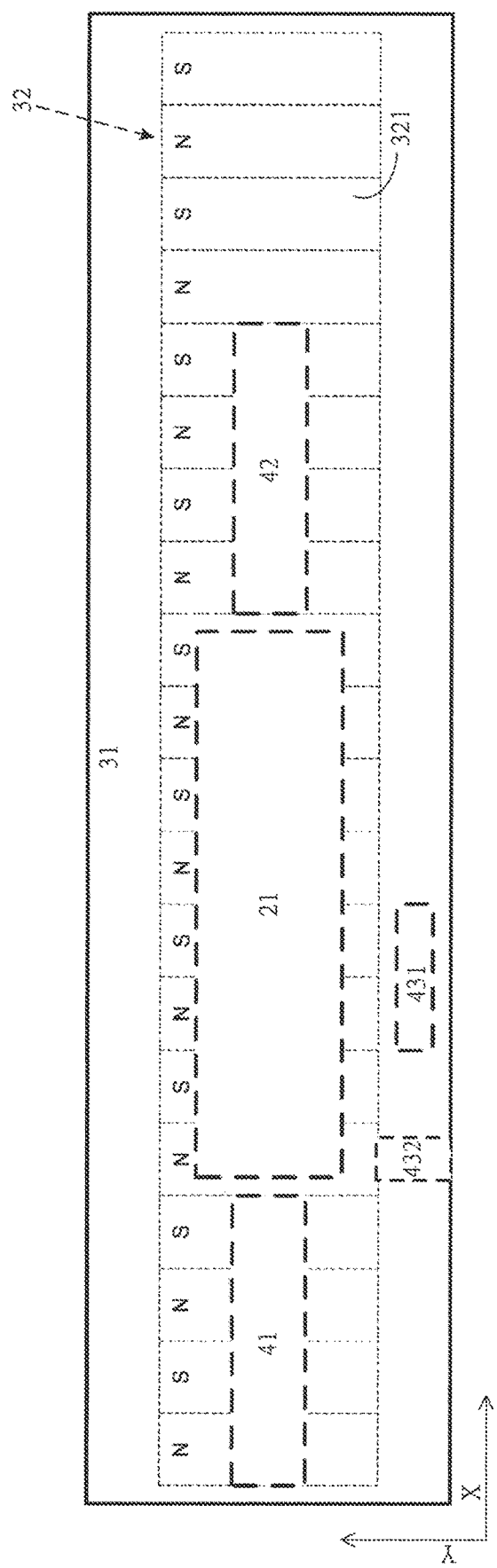
FIG. 5A is a bottom view of a preferred embodiment of the invention.
Figure 5B:
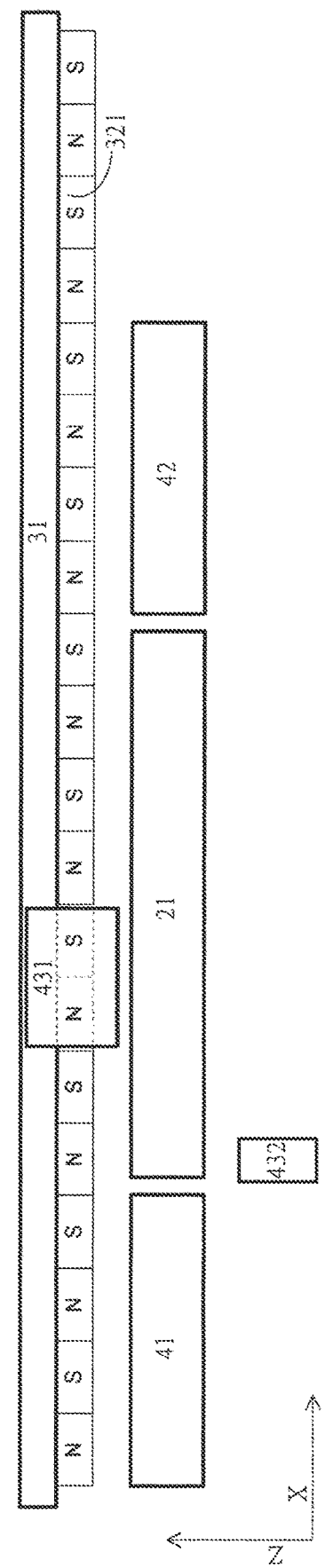
FIG. 5B is a side view of a preferred embodiment of the invention.

As shown in FIG. 5A, in terms of relative position in an X-axis direction, the first sensing portion 41 is located on a left side of the stator 21, and the second sensing portion 42 is located on a right side of the stator 21; and in a Y-axis direction, in addition to the first sensing portion 41 and the second sensing portion 42 locating relative to a center of the magnets 321 of the magnet array 32 as shown in FIG. 5A, the first sensing portion 41 and the second sensing portion 42 can also be shifted along the Y-axis direction to be located on one side of the magnet array 32 (not shown in the figure). The third sensing portion 43 corresponds to one side of the magnet array 32.

Figure 4:
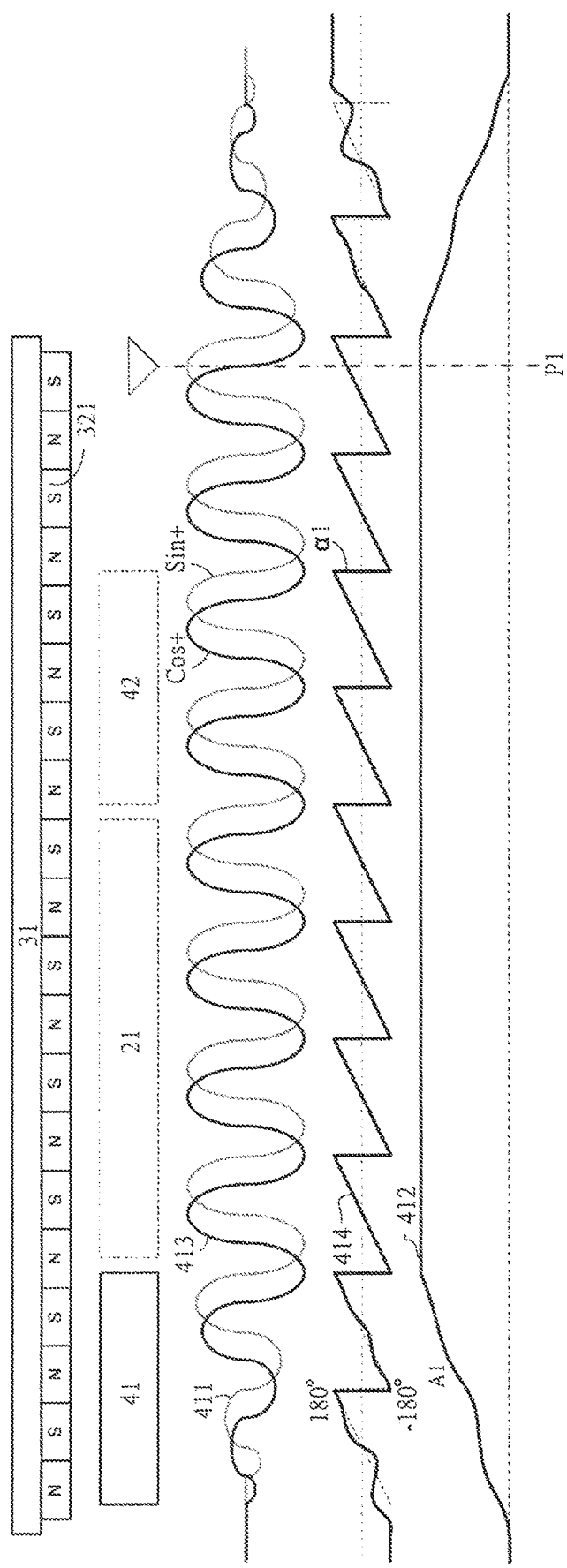
FIG. 4 is a schematic diagram of signals sensed by the first sensing portion of a preferred embodiment of the invention.

As shown in FIG. 4, during a movement of the carrier 31 moving from left to right to a current position P1, sine 411 amplitude 412 and cosine 413 signal in signals sensed by the first sensing portion 41 will change accordingly, wherein changes of the amplitude 412 will appear when the magnet array 32 does not cover all the magnetic sensitive elements H1-H8, that is, when the carrier 31 enters and exits a measuring range of the first sensing portion 41, the amplitude 412 will decrease, which will cause significant interference in a first cycle and a last cycle of subcycles α1, 414, wherein amplitudes A1, 412 are estimated by the following formula:

$$A=\sqrt{(U_{Cos+}-U_{Cos-})^2+(U_{Sin+}-U_{Sin-})^2},$$

wherein A is an amplitude, and Cos+, Sin+, Cos−, Sin− are sine and cosine differential signals respectively.

Similarly, sine amplitude and cosine signal in sensing signals output by the second sensing portion 42 also have the same situation as that of the first sensing portion 41.

Figure 6:
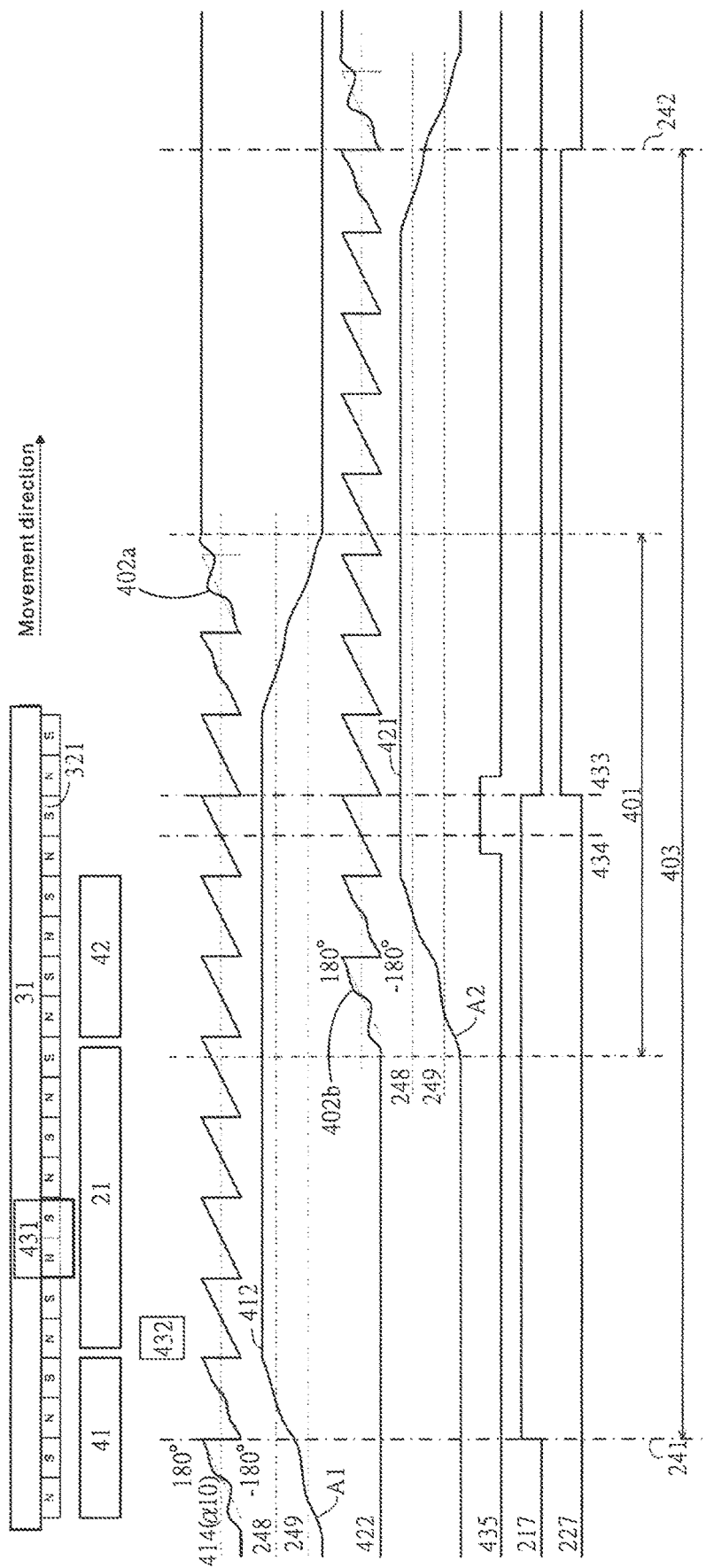
FIG. 6 is a schematic diagram of signal processing in a preferred embodiment of the invention in which a carrier moves from left to right to a current position.

As shown in FIG. 7, the stator 21 is disposed in a space pattern of interposing between the first sensing portion 41 and the second sensing portion 42, a length L21 of the stator 21 is smaller than a separation distance L40 between the first sensing portion 41 and the second sensing portion 42, a length of the separation distance L40 is an integral multiple of the magnetic period T, and must have a length of at least four magnetic periods τ to provide a sensing overlapping area 401 of the first sensing portion 41 and the second sensing portion 42 as shown in FIG. 6, and when signals of the first sensing portion 41 and the second sensing portion 42 are combined, signals of cycles 402a, 402b with lower accuracy are excluded. A length L1 of a measuring scale is an integral multiple of the magnetic period τ and is determined by the following formula 1:

$$L1=L40+(4+n)\tau,$$

wherein n is a natural number containing 0 (formula 1).

In this example, a length of the magnet array 32 is equal to the length L1 of the measuring scale.

As shown in FIG. 6, the third sensing portion 43 is located in the overlapping area 401 to provide a unique and distinct juncture 433 as a signal juncture of the first sensing portion 41 and the second sensing portion 42. In order to ensure a correctness of the juncture 433, it is required to make a length L431 of the signal unit 431 less than two magnetic periods τ as shown in FIG. 7, and to be determined by positions of a signal 435 of the signal unit 431 and the subcycle 414 of the first sensing portion 41 located at 180°, and in order to avoid influence by the cycles 402a, 402b with lower accuracy, a disposing position of the third sensing portion 43 is limited. For example, when a length of the magnetic sensitive elements H1~H8 is two magnetic periods τ, the signal unit 431 can be located in third and fourth overlapping periods in the overlapping area 401 of the first sensing portion 41 and the second sensing portion 42.

As shown in FIG. 6, the third sensing portion 43 is used to generate a unique and distinct zero point 434 in the overlapping area 401, and a position of the zero point 434 is defined by the signal unit 431 and the subcycle 414 of the first sensing portion 41, wherein the subcycle 414 of the first sensing portion 41 is equal to a threshold value α10, for example, the threshold value α10 shown in FIG. 6 is zero, and therefore, the length L431 of the signal unit 431 needs to satisfy formula 2:

$$(\pi-\alpha 10)*(\tau/2\pi)<L431<2\tau-[(\pi-\alpha 10)*(\tau/2\pi)] \quad \text{(formula 2)}.$$

As shown in FIG. 7, an offset distance (Ls) (not shown in the figure) of the sensitive element 432 is less than one magnetic period τ. A position of the sensitive element 432 is determined by the following formula, relative to an interval length L13 of the first subcycle 414 of the first sensing portion 41, the interval length L13 is:

$$\begin{cases} L13 = (Ls + n)\tau, \\ 0 \le Ls < \tau. \end{cases} \quad \text{(formula 3)}$$

an offset distance Lf (not shown in the figure) of the signal unit 431 is less than half of a length L431 of the signal unit 431, and a distance L211 between the signal unit 431 and the first magnetic period τ of the magnet array 32 is determined by the following formula 4:

$$\begin{cases} L211 = L13 - Lf + n\tau, \\ L211 \le L1 - L13 + Lf - 4\tau, \\ 0 \le Lf < L431/2. \end{cases} \quad \text{(formula 4)}$$

For example, in FIG. 6, the offset distance Ls of the sensitive element 432 is ¼ magnetic period τ, and the offset distance Lf of the signal unit 431 approaches zero.

In addition, the invention is capable of calculating a measuring range 403 of the measurement module 40 according to an action pattern of the moving portion 30. In FIG. 6, when the carrier 31 moves from left to right in a displacement, a starting point 241 and an ending point 242 of the measuring range 403 of the measurement module 40 are defined according to the following formula 5, wherein Alowth is a low threshold value 249, for example Alowth is 25% of a rated amplitude, and Ahighth is a high threshold value 248, for example, Ahighth is 75% of a rated amplitude. Therefore, the processing portion 44 calculates the amplitudes A1, 412 and the subcycles α1, 414 of the first sensing portion 41, and amplitudes A2, 421 and subcycles α2, 422 of the second sensing portion 42, which means that the amplitudes A1, 412 of the first sensing portion 41 are greater than the low threshold value 249, positions of the subcycles α1, 414 of the first sensing portion 41 equal to 180°, the amplitudes A2, 421 of the second sensing portion 42 are lower than the high threshold value 248, and positions of the subcycles α2, 422 of the second sensing portion 42 are 180°.

$$\text{Starting point:} \begin{cases} A1 > A_{lowth}, \\ \alpha1 = 180°, \end{cases}$$

$$\text{ending point:} \begin{cases} A2 < A_{highth}, \\ \alpha2 = 180°, \end{cases} \quad \text{(formula 5)}$$

When the carrier 31 moves from right to left in a displacement, the starting point 241 and the ending point 242 of the measuring range 403 of the measurement module 40 are defined according to the following formula 6, which means that the amplitudes A1, 412 of the first sensing portion 41 are smaller than the high threshold value 248, positions of the subcycles α1, 414 of the first sensing portion 41 equal to 180°, the amplitudes A2, 421 of the second sensing portion 42 are higher than the low threshold value 249, and positions of the subcycles α2, 422 of the second sensing portion 42 are 180°.

$$\text{Starting point:} \begin{cases} A2 > A_{lowth}, \\ \alpha2 = 180°, \end{cases}$$

$$\text{ending point:} \begin{cases} A1 < A_{highth}, \\ \alpha1 = 180°, \end{cases} \quad \text{(formula 6)}$$

Furthermore, when the carrier 31 enters the measuring range 403, the processing portion 44 feeds back calculated position information of the moving portion 30 to the driver 50, and then the driver 50 is used to control the stator 21 to perform current commutation. In this example, as shown in FIG. 7, a separation distance L25 between the first sensing portion 41 and the stator 21 is adjusted so that each of the magnetic sensitive elements H1~H8 of the first sensing portion 41 are in phase with a coil of the stator 21, thereby simplifying a power supply control mode of the stator 21.

The measuring range 403 is further divided into a first measuring range 217 and a second measuring range 227 based on the juncture 433 as a reference, wherein when the carrier 31 is located on a left side of the juncture 433, the carrier 31 is located in the first measuring range 217, and then the subcycle 414 of the first sensing portion 41 is used to calculate a position of the moving portion 30, and the position is fed back; when the carrier 31 is located on a right side of the juncture 433, the carrier 31 is located in the second measuring range 227, and then the subcycle 422 of the second sensing portion 42 is used to calculate a position of the moving portion 30, and the position is fed back.

In FIG. 7, in order to make the two adjacent measurement modules 40 have an overlapping area, a separation distance L11 between the first sensing portions 41 of each of the measurement modules 40 is equal to the length L1 of the magnet array 32.

Furthermore, as shown in FIG. 7, the two magnet arrays 32 are taken as an example, the two magnet arrays 32 are coaxially fixed on the carrier 31 along a long axial direction, in order to ensure a correctness of the calculated starting point 241 and ending point 242, a minimum spacing 1010 between the two adjacent magnet arrays 32 is equal to a length L2 of the first sensing portion 41, and equivalent to the two magnetic periods τ. In this example, at least one spacer 111, 112 is disposed between the two adjacent magnet arrays 32, and the minimum spacing L1010 is provided by a length of the at least one spacer 111, 112.)

It is to be understood that the above description is only preferred embodiments of the present invention and is not used to limit the present invention, and changes in accordance with the concepts of the present invention may be made without departing from the spirit of the present invention, for example, the equivalent effects produced by various transformations, variations, modifications and applications made to the configurations or arrangements shall still fall within the scope covered by the appended claims of the present invention.

What is claimed is:

1. A position measuring mechanism comprising:
   a base;
   a moving portion capable of moving relative to the base;
   at least one magnet array disposed in the moving portion;
   a first sensing portion and a second sensing portion respectively disposed on the base at intervals for sensing a magnetic field of the magnet array;
   a third sensing portion having a signal unit disposed on the moving portion, and a sensitive element disposed on the base for sensing the signal unit; and
   a processing portion receiving sensing signals of the first sensing portion and the second sensing portion respectively, calculating a subcycle corresponding to the magnet array, and performing operation in conjunction with sensing data of the sensitive element to obtain a movement path of the moving portion, and then feeding the movement path back to a driver to adjust a movement pattern of the moving portion;
   wherein the magnet array has a plurality of magnets, a minimum distance between the two magnets of a same magnetism is a magnetic period of the magnet array, and a length of the magnet array is an integral multiple of the magnetic period of the magnet array;
   wherein a quantity of the magnet array is two, and the magnet arrays are arranged adjacent to each other on the moving portion, and a spacing between the two adjacent magnet arrays is at least two magnetic periods.

2. The position measuring mechanism as claimed in claim 1, further comprising a plurality of measurement modules respectively including the first sensing portion, the second sensing portion and the third sensing portion, and a distance between the two adjacent measurement modules being equal to a length of the magnet array.

3. The position measuring mechanism as claimed in claim 1, wherein the first sensing portion and the second sensing portion respectively include eight magnetic sensitive elements, and each of the magnetic sensitive elements is arranged in order from left to right at a distance of a quarter of the magnetic period of the magnet array, the first magnetic sensitive element is connected in parallel with the fifth magnetic sensitive element, the second magnetic sensitive element is connected in parallel with the sixth magnetic sensitive element, the third magnetic sensitive element is connected in parallel with the seventh magnetic sensitive element, and the fourth magnetic sensitive element is connected in parallel with the eighth magnetic sensitive element.

4. The position measuring mechanism as claimed in claim 1, wherein the driver controls a current of a stator provided on the base, and uses a fieldbus to connect to a motion controller.

5. The position measuring mechanism as claimed in claim 4, wherein the first sensing portion is located on a left side of the stator, and the second sensing portion is located on a right side of the stator;
- a separation distance between the first sensing portion and the second sensing portion is an integral multiple of the magnetic period of the magnet array;
- a length of the magnet array is greater than the separation distance between the first sensing portion and the second sensing portion, and is at least four magnetic periods of the magnet array; and
- the third sensing portion provides a juncture as a reference to combine signals of the first sensing portion and the second sensing portion.

6. The position measuring mechanism as claimed in claim 1, wherein the third sensing portion combining signals sensed by the first sensing portion and the second sensing portion in a measuring range respectively with a juncture.

7. The position measuring mechanism as claimed in claim 6, wherein the measuring range is divided into a first measurement section of the first sensing portion and a second measurement section of the second sensing portion with the juncture, the first measurement section and the second measurement section are respectively configured along a movement direction of the moving portion and are adjacent to each other.

8. The position measuring mechanism as claimed in claim 7, wherein:
- when the moving portion moves and displaces from right to left, a starting point of the measuring range is defined as: a signal amplitude sensed by the first sensing portion is less than a predetermined high threshold value, and a subcycle position of a signal sensed by the first sensing portion is equal to 180°; an ending point of the measuring range is defined as: a signal amplitude sensed by the second sensing portion is higher than a predetermined low threshold value, and a subcycle position of a signal sensed by the second sensing portion is equal to 180°; and
- when the moving portion moves and displaces from left to right, a starting point of the measuring range is defined as: a signal amplitude sensed by the first sensing portion is greater than the low threshold value, and a subcycle position of a signal sensed by the first sensing portion is equal to 180°; an ending point of the measuring range is defined as: a signal amplitude sensed by the second sensing portion is less than the low threshold value, and a subcycle position of a signal sensed by the second sensing portion is equal to 180°.

* * * * *